(12) United States Patent
Chen et al.

(10) Patent No.: US 11,557,352 B2
(45) Date of Patent: Jan. 17, 2023

(54) ADJUSTABLE READ RETRY ORDER BASED ON DECODING SUCCESS TREND

(71) Applicant: Western Digital Technologies, Inc., San Jose, CA (US)

(72) Inventors: Niang-Chu Chen, Irvine, CA (US); Jun Tao, Ladera Ranch, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/244,794

(22) Filed: Apr. 29, 2021

(65) Prior Publication Data

US 2021/0249088 A1  Aug. 12, 2021

Related U.S. Application Data

(63) Continuation of application No. 16/824,584, filed on Mar. 19, 2020, now Pat. No. 11,017,867, which is a
(Continued)

(51) Int. Cl.
*G11C 16/26* (2006.01)
*G11C 16/08* (2006.01)
(Continued)

(52) U.S. Cl.
CPC ............. *G11C 16/26* (2013.01); *G11C 8/10* (2013.01); *G11C 11/4087* (2013.01);
(Continued)

(58) Field of Classification Search
CPC ...... G11C 16/26; G11C 16/08; G11C 16/0483
See application file for complete search history.

(56) References Cited

U.S. PATENT DOCUMENTS

2015/0085571 A1  3/2015  Hu et al.
2016/0274969 A1  9/2016  Chen et al.
(Continued)

FOREIGN PATENT DOCUMENTS

JP  2007-274239     10/2007
KR  20150091693 A   8/2015
(Continued)

OTHER PUBLICATIONS

International Search Report and Written Opinion from PCT/US2019/017119, dated May 28, 2019, 12 pages.

*Primary Examiner* — Alfredo Bermudez Lozada
(74) *Attorney, Agent, or Firm* — Morgan, Lewis & Bockius LLP

(57) ABSTRACT

Methods, systems, and media for decoding data are described. A sequence of read-level voltages for decoding operations may be determined based on a trend of decoding success indicators, including a first decoding success indicator and a second decoding success indicator. The first decoding success indicator is obtained from a more recent successful decoding operation. The first one of the sequence may be set to a read-level voltage of the first decoding success indicator. If the read-level voltage of the first decoding success indicator is less than a read-level voltage of the second decoding success indicator, then the trend is decreasing, and the second one of the sequence may be set to a read-level voltage less than that of the first one of the sequence. After executing one or more decoding operations, the decoding success indicators may be updated based on the read-level voltage of the current successful decoding operation.

20 Claims, 7 Drawing Sheets

Related U.S. Application Data continuation of application No. 16/052,523, filed on Aug. 1, 2018, now Pat. No. 10,636,495.

(60) Provisional application No. 62/684,157, filed on Jun. 12, 2018.

(51) Int. Cl.
| | |
|---|---|
| *G11C 11/56* | (2006.01) |
| *G11C 11/408* | (2006.01) |
| *G11C 29/42* | (2006.01) |
| *G11C 29/52* | (2006.01) |
| *G11C 8/10* | (2006.01) |
| *H03M 13/11* | (2006.01) |
| *G11C 29/44* | (2006.01) |
| *G11C 16/04* | (2006.01) |

(52) U.S. Cl.
CPC .......... *G11C 11/5642* (2013.01); *G11C 16/08* (2013.01); *G11C 29/42* (2013.01); *G11C 29/44* (2013.01); *G11C 29/52* (2013.01); *H03M 13/1102* (2013.01); *G11C 16/0483* (2013.01); *G11C 2211/5632* (2013.01)

(56) References Cited

U.S. PATENT DOCUMENTS

2016/0306693 A1* 10/2016 Lin ................. G11C 29/028
2018/0034485 A1    2/2018 Marelli et al.
2018/0181462 A1    6/2018 Shukla

FOREIGN PATENT DOCUMENTS

KR    10-2016-0113001    9/2016
KR    10-2018-0003320    1/2018

* cited by examiner

ADJUSTABLE READ RETRY ORDER BASED ON DECODING SUCCESS TREND

CROSS-REFERENCE TO RELATED APPLICATION

This application is a continuation of application Ser. No. 16/824,584, filed on Mar. 19, 2020, now U.S. Pat. No. 11,017,867, which is a continuation of application Ser. No. 16/052,523, filed on Aug. 1, 2018, now U.S. Pat. No. 10,636,495, which claims the benefit of U.S. Provisional Application No. 62/684,157, filed on Jun. 12, 2018, the entirety of each of which is incorporated herein by reference for all purposes.

BACKGROUND

Flash memory may introduce data errors to data stored therein due to variations in the memory cells introduced at the time of manufacture or due to changes in behavior as the memory cells age. Error correcting codes may be employed to correct data errors during read operations. For example, low-density parity-check (LDPC) codes and Bose Chaudhuri Hocquenghem (BCH) codes can provide robust error correcting capabilities. However, applying error correcting capabilities of LDPC and BCH codes can add unwanted latency to read operations.

DETAILED DESCRIPTION

Figure 1:
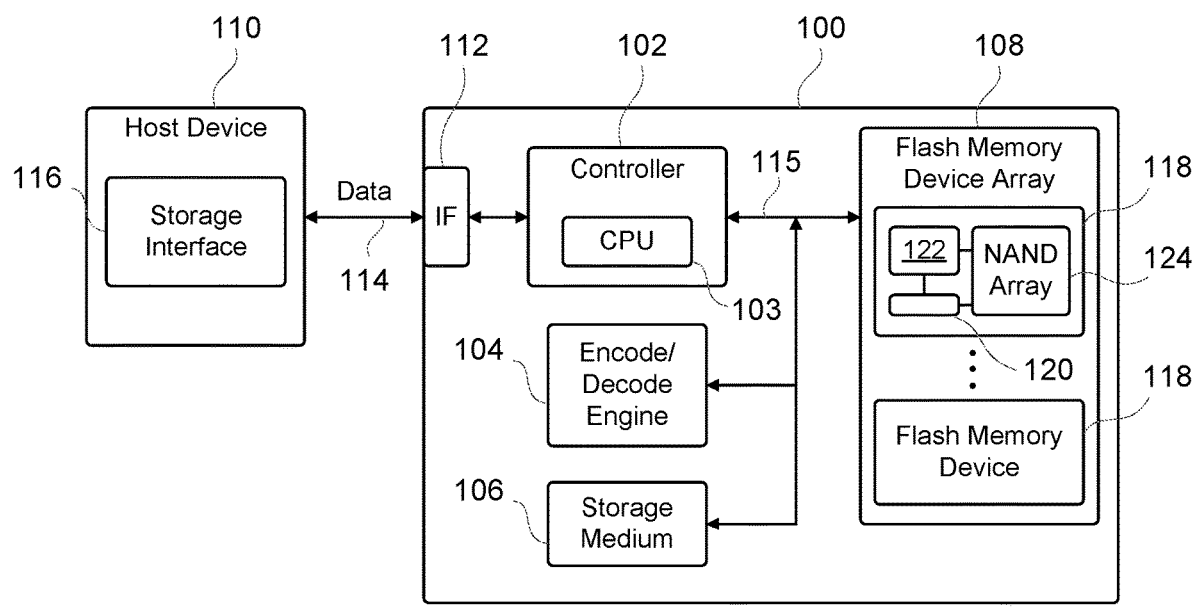
FIG. 1 is a block diagram depicting example components of a data storage system according to aspects of the subject technology.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent to those skilled in the art that the present disclosure may be practiced without these specific details. In some instances, structures and components are shown in block diagram form in order to avoid obscuring the concepts of the present disclosure. Like components are labeled with identical element numbers for ease of understanding.

Due to high error rates observed in non-volatile memory such as NAND flash memory, different error recovery methods such as LDPC and BCH decoding may be utilized for a multi-stage decoding operation, e.g., one or more stages of decoding operation, to decode data read from a group of memory cells in non-volatile memory. The data processed in each stage of the decoding operation may be read from the memory cells using a respective read-level voltage from a sequence of different read-level voltages. Each stage may execute a hard decoding operation on the data and/or one or more soft decoding operations on the data. The multi-stage decoding operation may execute one stage at a time in a predetermined sequence until the data read from the memory cells is successfully decoded.

In one or more aspects, it is desirable to improve performance of these error correction methods, especially the time spent on retrying reading and decoding data. One or more aspects of the subject technology use a decoding success trend (or decoding error trend) to predict the error type and determine optimal read-level voltages for read retries.

Memory cells in the same block, group of blocks, die, or batch of die may share common characteristics that result in similarities in read errors experienced when reading data from the block, group of blocks, die, or batch of die. Read errors experienced when reading data from memory cells at a similar stage of life also may have similarities. Read errors may be caused by various factors such as the temperature, read disturb, program/erase counts, age, and data retention ability. Some of these factors may be common to some or many of memory cells.

In one or more aspects, the subject technology leverages these similarities to improve the multi-stage decoding operation by tracking the trend of decoding success indicators and corresponding read-level voltages at which previous decoding operations successfully decoded the data read from memory cells. Read errors experienced in other similarly situated memory cells may be recovered using the same trend. For example, a bit shift within the same block tends to move in the same direction. Hence, using the previous successful read-level voltages, a decoding success trend can be predicted, and the read-level voltage candidates can be optimally re-ordered.

One or more aspects of the subject technology may determine not only the optimal read-level voltage for the first read retry but also the optimal read-level voltages for the subsequent read retries if the first read retry fails. In one or more examples, the read-level voltage for the first read retry may be the read-level voltage of the last successful decoding operation. A read-level for a second read retry may be determined based on the trend of the two successful read-level voltages from the prior decoding operations. The comparison of the last two successful read-level voltages may provide a moving direction or a trend. This direction or trend can be followed to predict the next read-level voltages to read and decode data with less error.

One or more aspects of the subject technology provide several performance advantages such as reducing the number of read retries and improving error recovery efficiency, in particular for non-volatile memory, such as NAND flash memory, experiencing high error rate, being subject to high temperature, or reaching the end of life. In addition, one or more aspects of the subject technology are not limited to LDPC and BCH and may be utilized with various other decoding methods.

As will be discussed in more detail below, in one or more aspects, a sequence of read-level voltages may be adjusted or set based on a trend of decoding success indicators. In one or more examples, a sequence of read-level voltages may be adjusted based on the last successful read-level voltage and a trend between the last successful read-level voltage and the second to the last successful read-level voltage. In one or more examples, a first read-level voltage of the sequence may be set to the last successful read-level voltage. A second read-level voltage of the sequence may be determined based on the first read-level voltage and the trend.

In one or more examples, if the last successful read-level voltage is lower than the second to the last successful read-level voltage, then the trend is decreasing in voltage. The second read-level voltage may thus be set to a read-level voltage lower than the first read-level voltage. In one or more examples, if the last successful read-level voltage is higher than the second to the last successful read-level voltage, then the trend is increasing in voltage. The second read-level voltage may thus be set to a read-level voltage higher than the first read-level voltage.

In some examples, one or more subsequent read-level voltages of the sequence may be determined based on the same trend. In some examples, one or more subsequent read-level voltages may be determined based on a direction that is reverse of the trend. One or more current decoding operations may be executed to decode data based on the adjusted sequence of read-level voltages. If one of the one or more current decoding operations is successful and the current successful read-level voltage is different from the last successful read-level voltage, then the last successful read-level voltage and the second to the last successful read-level voltage may be updated. A sequence of read-level voltages may then be re-adjusted based on the updated information.

FIG. 1 is a block diagram depicting example components of a data storage system 100, according to aspects of the subject technology. Data storage system 100 includes, among other things, controller 102, encode/decode engine 104, storage medium 106, and flash memory device array 108. As depicted in FIG. 1, data storage system 100 may be connected to a host device 110 via host interface 112.

Controller 102 may include several internal components (not shown) such as one or more processors 103, a read-only memory, a flash component interface (for example, a multiplexer to manage instruction and data transport along a connection to flash memory device array 108), an I/O interface, error correction circuitry, and the like. A processor of controller 102 may monitor and control the operation of the components in data storage controller 102. The processor and/or controller 102 may be a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. In some aspects, one or more elements of controller 102 may be integrated into a single chip. In other aspects, the elements may be implemented on two or more discrete components.

Controller 102 may execute code or instructions to perform the operations and functionality described herein. For example, controller 102 may perform operations for managing request flow and address mappings, and to perform calculations and generate commands. One or more sequences of instructions may be stored as firmware on memory within controller 102. One or more sequences of instructions may be software stored and read from storage medium 106, flash memory device array 108, or received from host device 110 (for example, via host interface 112). Storage medium 106 and flash memory device array 108 represent examples of machine or computer readable media on which instructions/code executable by controller 102 may be stored. Machine or computer readable media may generally refer to any tangible and non-transitory medium or media used to provide instructions to controller 102, including both volatile media, such as dynamic memory used for storage media or for buffers within controller 102, and non-volatile media, such as electronic media, optical media, and magnetic media. The operations and functionality described herein also may be implemented in hardware using logic circuits, for example, or a combination of hardware and software/firmware.

In some aspects, storage medium 106 represents the volatile memory used to temporarily store data and information used to manage data storage system 100. According to aspects of the present disclosure, storage medium 106 is a random access memory (RAM) such as double data rate (DDR) RAM. Other types of RAM also may be used to implement storage medium 106. Storage medium 106 may be implemented using a single RAM module or multiple RAM modules. While storage medium 106 is depicted as being distinct from controller 102, it is understood that storage medium 106 may be incorporated into controller 102 without departing from the scope of the present disclosure. Alternatively, storage medium 106 may be a non-volatile memory such as a magnetic disk, flash memory, peripheral SSD, and the like.

Host interface 112 may be coupled to host device 110, to receive data from and send data to host device 110. Host interface 112 may include both electrical and physical connections for operably coupling host device 110 to controller 102. Host interface 112 may communicate data, addresses, and control signals between host device 110 and controller 102. In this manner, controller 102 may store data received from host device 110 in flash memory device array 108 in response to a write command from host device 110, and to read data stored in flash memory device array 108 and to transfer the read data to host device 110 via host interface 112 in response to a read command from host device 110.

Host device 110 represents any device that may be coupled to data storage system 100 and to store data in data storage system 100. Host device 110 may be a computing system such as a personal computer, a server, a workstation, a laptop computer, PDA, smart phone, and the like. Alternatively, host device 110 may be an electronic device such as a digital camera, a digital audio player, a digital video recorder, and the like.

As further depicted in FIG. 1, host device 110 and data storage system 100 may be in communication with each other via a bus 114. The bus may use suitable interfaces standard including, but not limited to, serial advanced technology attachment (SATA), advanced technology attachment (ATA), small computer system interface (SCSI), PCI-extended (PCI-X), fiber channel, serial attached SCSI (SAS), secure digital (SD), embedded multi-media card (EMMC), universal flash storage (UFS) and peripheral component interconnect express (PCIe). According to some aspects, data storage system 100 may include pins (or a socket) to mate with a corresponding socket (or pins) on host device 110 to establish an electrical and physical connection.

Controller may include an internal system bus 115. System bus 115 may include a combination of a control bus, address bus, and data bus, and connect the components of controller 102 (e.g., a processor and/or memory therein) with other components of data storage system 100, including encode/decode engine 104, storage medium 106, flash memory device array 108, and host interface 112. Data is transferred between the various components over system bus 115. System bus 115 may reside partially external and partially internal to controller 102.

Host device 110 and data storage system 100 may be in communication with each other via a wired or wireless connection and may be local to or remote from one another. According to one or more other aspects, data storage system 100 (or host interface 112) includes a wireless transceiver to place host device 110 and data storage system 100 in wireless communication with each other.

Controller 102 may receive data and/or storage access commands from a storage interface module 116 (e.g., a device driver) of host device 110. Storage access commands communicated by the storage interface module 116 may include read and write commands issued by the host device 110. Read and write commands may specify a logical address, e.g., logical block addresses (LBAs) used to access data stored in the data storage system 100. Controller 102 may execute commands in the flash memory device array 108 in response to commands received from storage interface module 116.

Flash memory device array 108 may include multiple flash memory devices 118. A flash memory device 118 represents a non-volatile memory device for storing data. According to aspects of the subject technology, flash memory device 118 includes, for example, a NAND flash memory. Each flash memory device 118 may include a single flash memory chip or die, or may include multiple flash memory chips or die. For example, within flash memory device array 108, some of the flash memory devices 118 may comprise one flash die while others may comprise more than one flash die. Flash memory device 118 is not limited to any particular capacity or configuration. For example, the number of physical blocks, the number of physical pages per physical block, the number of sectors per physical page, and the size of the sectors may vary within the scope of the subject technology.

Flash memory devices 118 may be arranged in multiple channels, with each channel having one or more flash memory devices 118. A flash memory device 118 may include one or more flash memory interfaces (not shown). Each flash memory interface interfaces the controller 102 to one of the flash memory devices via a corresponding channel. Each of the channels (not shown) may be implemented using one or more physical I/O buses coupled between one of the flash memory interfaces and the corresponding flash device(s). Each channel allows the corresponding flash memory interface to send read, write and/or erase commands to the corresponding flash memory device. Each flash memory interface may include a register (e.g., First-In-First-Out (FIFO) register) that queues read, write and/or erase commands from the controller 102 for the corresponding flash memory device. Although the term "channel," as used above, referred to the bus coupled between a flash memory interface and the corresponding flash memory device, the term "channel" may also refer to the corresponding flash memory device that is addressable through a bus (e.g., system bus 115).

Flash memory device 118 may have a standard interface specification. This standard ensures that chips from multiple manufacturers can be used interchangeably. The interface of flash memory device 118 may be used to access internal registers 120 and an internal flash controller 122. In some aspects, registers 120 may include address, command, and/or data registers, which internally retrieve and output the necessary data to and from a NAND memory cell array 124. By way of example, memory cell array 124 may comprise a single-level cell (SLC) memory, a multi-level cell (MLC) memory, a three-level cell (TLC) memory device, etc. In some aspects, the flash memory device array 108 may comprise one or more hybrid memory devices that may function in one or more of a SLC, MLC or TLC mode. Other types of flash memory such as 3D NAND flash memory also are contemplated in the subject technology.

Data register (e.g., of registers 120) may include data to be stored in memory cell array 124, or data after a fetch from memory cell array 124, and may also be used for temporary data storage and/or act like a buffer. An address register may store the memory address from which data will be fetched to host device 110 or the address to which data will be sent and stored. In some aspects, a command register is included to control parity, interrupt control, and the like. In some aspects, internal flash controller 122 is accessible via a control register to control the general behavior of flash memory device 118. Internal flash controller 122 and/or the control register may control the number of stop bits, word length, receiver clock source, and may also control switching the addressing mode, paging control, co-processor control, and the like.

Encode/decode engine 104 represents one or more components that may encode and/or decode code words to be stored in and/or read from the flash memory device array 108. Encode/decode engine 104 may include an encoder and a decoder. The decoder may include a hard decoder and a soft-decision ECC decoder. Encode/decode engine 104 may encode data received from host device 110 and decode code words read from the flash memory device 118 before sending the decoded data to the host. In some implementations, encode/decode engine 104 may comprise one or more memory devices and/or one or more processing units used to perform error correction (e.g., using LDPC, BCH, or turbo codes). Encode/decode engine 104 may also include a soft information module that determines and/or maintains soft metric inputs for encoding and decoding operations. While encode/decode engine 104 is depicted as being distinct from controller 102, it is understood that encode/decode engine 104 may be incorporated into controller 102 without departing from the scope of the present disclosure.

Figure 2:
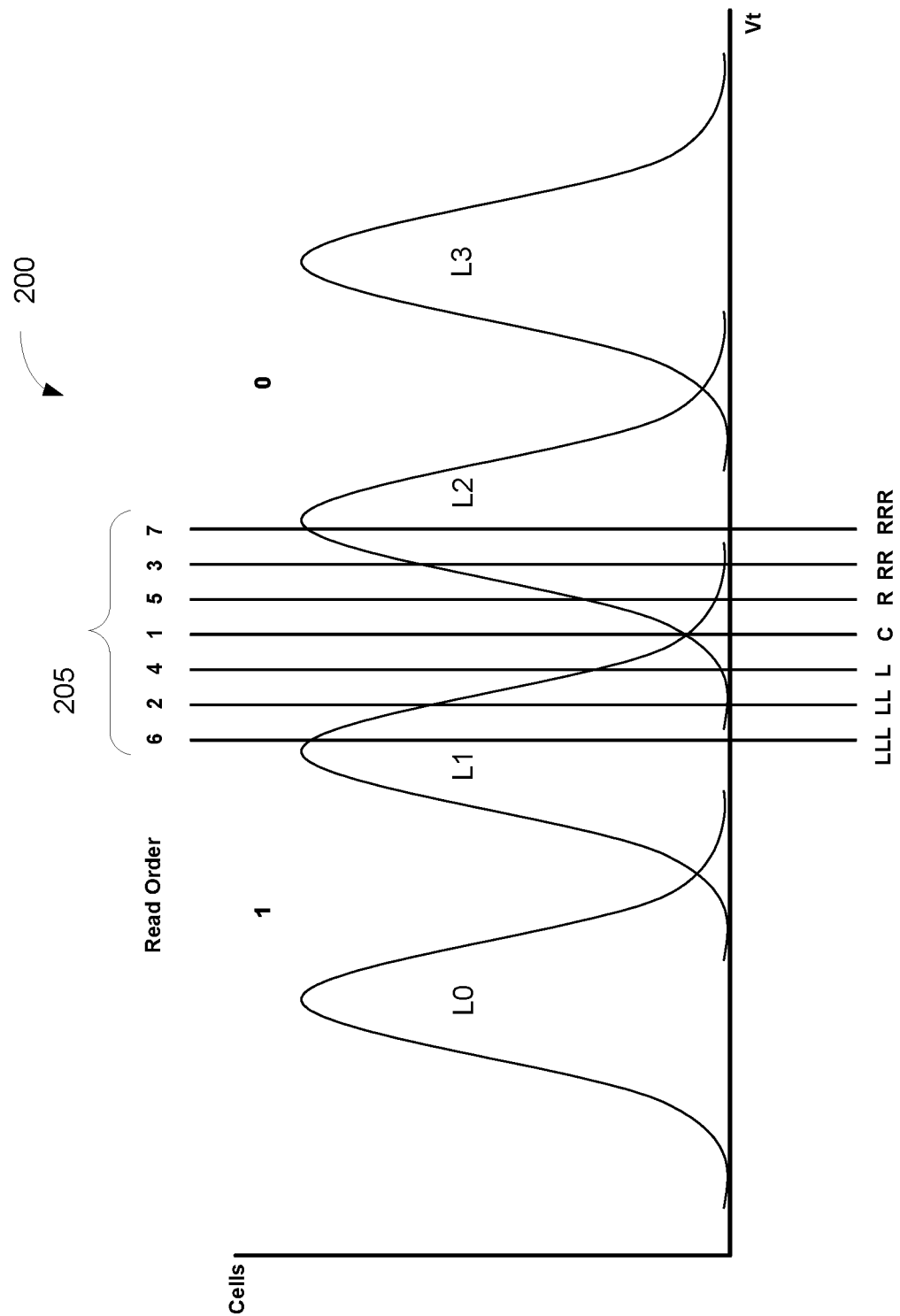
FIG. 2 depicts an example graph diagram illustrating four possible cell program distributions in a multi-level cell flash memory according to aspects of the subject technology.

FIG. 2 depicts an example graph diagram 200 illustrating four possible cell program distributions in a multi-level cell (MLC) flash memory, according to aspects of the subject technology. As depicted, MLC NAND cells may be programmed to one of four different states or program levels, L0, L1, L2, and L3, yielding two logical bits of information per cell: the Most Significant Bit (MSB) and the Least Significant Bit (LSB). When memory cells are read or programmed, these two bits may make up corresponding MSB and LSB pages of a memory block. Program levels L0 and L1 may correspond to an LSB logical bit value of "one" and program levels L2 and L3 may correspond to an LSB logical bit value of "zero." While not indicated in FIG. 2, program levels L0 and L3 may correspond to an MSB logical bit value of "one" and program levels L1 and L2 may correspond to an MSB logical bit value of "zero."

To read data from the memory cells, a read-level voltage is applied to the memory cells and memory cells having a threshold voltage (Vt) at or below the applied read-level voltage and therefore turn on or conduct are considered to be part of a program distribution below the read-level voltage and those memory cells having a threshold voltage above the read-level voltage and therefore do not turn on or conduct are considered to be in a program distribution above the read-level voltage. For example, FIG. 2 depicts a read-level voltage C that may be applied to a group of memory cells to determine which cells are programmed in either the L0 or L1 program levels corresponding to an LSB logical bit value of "one" or the L2 or L3 program levels corresponding to an LSB logical bit value of "zero."

As flash memory is cycled (that is, programmed and erased repeatedly), its physical qualities change. For example, the repeated placement and removal of electrons on the floating gate during programming and erase operations, respectively, may cause some electrons to be trapped in the floating gate of the device. The threshold voltages of these memory cells may eventually take on values that are different (higher or lower) than expected values, causing the cell programming distributions ultimately begin to overlap, and causing read errors when the data is read.

To determine a probability that the memory cells were actually programmed to the observed putative program levels (i.e., read data), multiple read operations may be initiated as part of a multi-stage decoding operation. For example, the memory cells may be read at read-level voltage C in a first stage, at read-level voltage LL in a second stage, at read-level voltage RR in a third stage, etc. The multi-stage decoding operation is described in more detail with respect to FIG. 3A. The sequence of read-level voltages sets up multiple program regions that may be used to categorize the data values read from the memory cells for soft decoding, should hard decoding of the data fail. The sequence of read-level voltages may be used in read-level voltage order 205 as shown in FIG. 2.

In a first stage of the multi-stage decoding operation, two program regions may be defined. A first program region includes cells having a programmed value at or below read-level voltage C and a second program region includes cells having a programmed value above read-level voltage C. In the second stage of the multi-stage decoding operation, three program regions may be defined by aggregating the data read using read-level voltage C with data read using read-level voltage LL. More particular, a first program region may include cells having a programmed value at or below read-level voltage LL, a second program region may include cells having a programmed value above read-level voltage LL and at or below read-level voltage C, and a third program region may include cells having a programmed value above read-level voltage C. Each subsequent stage in the multi-stage decoding operation aggregates data read using the read-level voltage corresponding to the stage with the data read in the preceding stages to define additional program regions corresponding to the ranges of program values between the different read-level voltages. The subject technology is not limited to the number of read-level voltages represented in FIGS. 2 and 3A or to the read order indicated in FIGS. 2 and 3A for applying the read-level voltages in respective stages of the multi-stage decoding operation. In addition, similar sequences of read-level voltages may be used for reading the MSB bit values in the regions between the L0 and L1 program levels and between the L2 and L3 program levels.

According to aspects of the subject technology, confidence values may be assigned to the respective program regions or "bins" for use in soft-decoding operations. Confidence values may include log-likelihood ratios (LLRs). In LDPC or BCH applications, a binary LLR may include the logarithm of a ratio between the probability of a bit being "0" or "1". A positive LLR may indicate that a signal read from the memory cell may likely be a 0-bit, and a negative LLR may indicate that the signal read from the memory cell may likely be a 1-bit. In some examples, a bit value having an assigned LLR equal to five may be more likely to be a first predetermined value (e.g., a binary "0") than a bit value having an assigned LLR equal to a second predetermined value (e.g., a binary "1"). A bit value having an assigned LLR equal to zero may be equally likely to be either of the first and second predetermined values. An LLR may also be represented by a non-binary confidence vector having a group of values.

As introduced above, each stage of the multi-stage decoding process defines a set of program regions or bins. Each set of program regions or bins has a set of confidence values (e.g., LLR values) corresponding to the respective program regions or bins of the set. These confidence values may be referred to as decoding information and may be stored in respective tables or other data structures that are retrieved when performing soft decoding operations in each of the stages.

According to various implementations, when performing decoding operations encode/decode engine 104 may use different sets of decoding information and different orderings of the sets of decoding information for each stage of decoding. Further, different sets of decoding information may be used based on the age of a respective block(s) of the memory device. For example, the age of a block(s) may be based on a number of programming/erase cycles associated with the block, and there may be a different group of sets of decoding information for each predetermined range of programming/erase cycles (and/or for each read-level voltage). According to aspects of the subject technology, each stage of decoding may use multiple sets of decoding information (e.g., three) with separate soft decoding operations being performed using respective sets of decoding information.

Figure 3A:
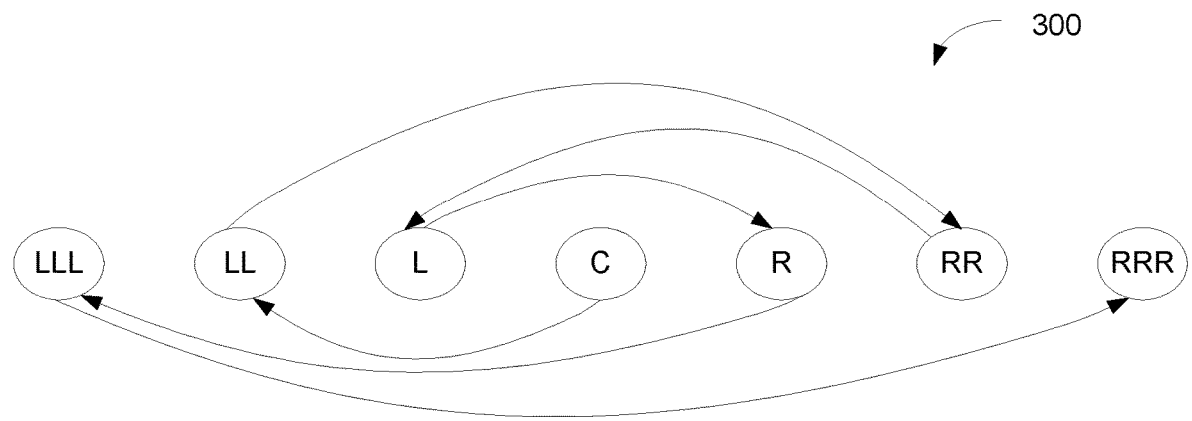
FIG. 3A depicts an example of a default read-level voltage order according to aspects of the subject technology.

FIG. 3A depicts an example of a default (or predefined) read-level voltage order, according to aspects of the subject technology. The default read-level voltage order 300 is also shown as read-level voltage order 205 in FIG. 2 and includes a center read-level voltage C, three lower read-level voltages, and three upper read-level voltages. The three lower read-level voltages may be arranged in a decreasing order as L, LL, and LLL, with read-level voltage LLL being the lowest read-level voltage. The three upper read-level voltages may be arranged in an ascending order as R, RR, and RRR, with read-level voltage RRR being the highest read-level voltage. In some examples, the default read order is used when for the first time a memory block (e.g., two or more memory cells) is decoded and there is no history of previous reads. In some examples, the default read order is used when a history of previous reads of the memory block is not reliable. In some embodiments, read-level voltages C, L, R, RR, LL, RRR, and LLL correspond to predefined voltages. In some examples as shown in FIG. 3A, the default read order starts from the center read-level voltage C and continues with read-level voltage LL, then RR, then L, then R, then LLL, and then RRR in that order.

FIGS. 3B through 3F depict examples of trend-based read-level voltage orders, according to aspects of the subject technology. As shown in read-level voltage order diagrams 310 through 350, read-level voltage 355 may correspond to a read-level voltage that was last used (or most recently used) in a successful decoding operation (e.g., the last successful read-level voltage). Additionally, read-level voltage 349 may correspond to a read-level voltage that was used in a successful decoding operation prior to the last successful decoding operation (e.g., the second to the last successful read-level voltage). In some examples, a trend of change in read-level voltage corresponding to successful decoding operations is determined based on a trend between read-level voltages 349 and 355. In some examples, read-level voltage 355 may be selected as a preliminary read-level voltage that is initially used for a decoding operation. Details about decoding operations are described with reference to FIGS. 4 through 6. In one or more examples, controller 102 may perform one or more processes described with respect to FIGS. 3B through 3F.

Figure 3B:
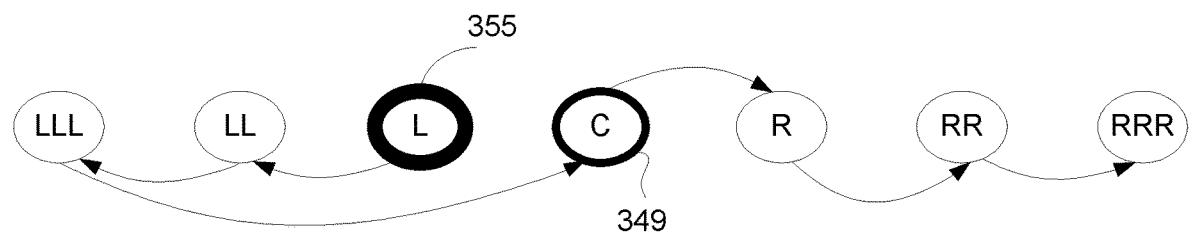
FIGS. 3B through 3F depict examples of adjusting read-level voltage orders based on a trend of successful decoding operations according to aspects of the subject technology.

Referring to FIG. 3B, as shown in diagram 310, a preliminary read-level voltage is set to L, which is read-level voltage 355. The trend is determined to be decreasing because read-level voltage 355 is lower than read-level voltage 349. In other words, the change from read-level voltage 349 to read-level voltage 355 indicates a decrease in voltage. Thus, in this example, based on the decreasing trend, a secondary read-level voltage (a next read-level voltage) is obtained (e.g., determined, selected or set) as read-level voltage LL which is the next lower read-level voltage that is less than preliminary read-level voltage L. Using the same decreasing trend, the next read-level voltage is determined to be LLL because LLL is the next lower read-level voltage. As LLL is the lowest read-level voltage, there is no read-level voltage that is lower than LLL. Hence, at this point, the direction used to select subsequent read-level voltages becomes reversed (i.e., the direction becomes reverse of the trend), and a next read-level voltage is determined as C. Read-level voltage C is higher than any of the read-level voltages that have been selected (i.e., L, LL and LLL), and C is the lowest read-level voltage among the read-level voltages that have not been selected (i.e., C, R, RR and RRR). C is next to preliminary read-level voltage L, and is the next higher read-level voltage compared to L. Using the same reversed direction (i.e., increasing in voltage), the next read-level voltage is determined to be R because R is the next higher read-level voltage. Using the same reversed direction, the next read-level voltage is determined to be RR because RR is the next higher read-level voltage. Using the same reversed direction, the next read-level voltage is determined to be RRR because RRR is the next higher read-level voltage. Accordingly, based on read-level voltage 335 and the trend determined by read-level voltages 335 and 349 of the prior successful decoding operations, the sequence of read-level voltages is obtained (e.g., adjusted, determined, selected or set) as L, LL, LLL, C, R, RR, and RRR in that order to be used for a multi-stage decoding operation.

Figure 3C:
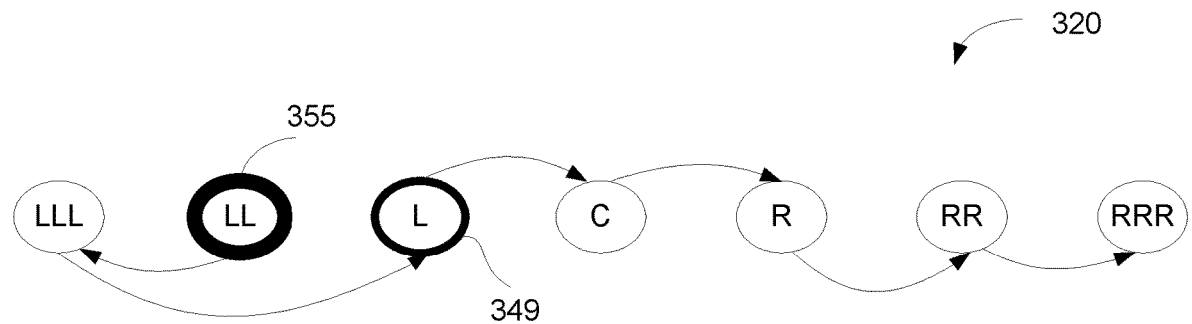

Referring to FIG. 3C, as shown in diagram 320, a preliminary read-level voltage is LL, which is read-level voltage 355. The trend is decreasing because read-level voltage 355 is lower than read-level voltage 349. Thus, in this example, based on the decreasing trend, a secondary read-level voltage is obtained as read-level voltage LLL because LLL is the next lower read-level voltage that is less than LL. As LLL is the lowest read-level voltage, there is no read-level voltage that is lower than LLL. Hence, at this point, the direction is reversed, and a next read-level voltage is determined as L. Read-level voltage L is higher than any of the read-level voltages that have been selected (i.e., LL and LLL). In addition, L is the lowest read-level voltage among the read-level voltages that have not been selected (i.e., L, C, R, RR and RRR). L is next to preliminary read-level voltage LL, and is the next higher read-level voltage compared to LL. Using the same reversed direction, the next read-level voltage is C because C is the next higher read-level voltage. Using the same reversed direction, the next read-level voltage is R because R is the next higher read-level voltage. Using the same reversed direction, the next read-level voltage is RR because RR is the next higher read-level voltage. Using the same reversed direction, the next read-level voltage is RRR because RRR is the next higher read-level voltage. As a result, based on read-level voltage 335 and the trend determined by read-level voltages 335 and 349 from the prior successful decoding operations, the sequence of read-level voltages is obtained as LL, LLL, L, C, R, RR, and RRR in that order to be used for a multi-stage decoding operation.

Figure 3D:
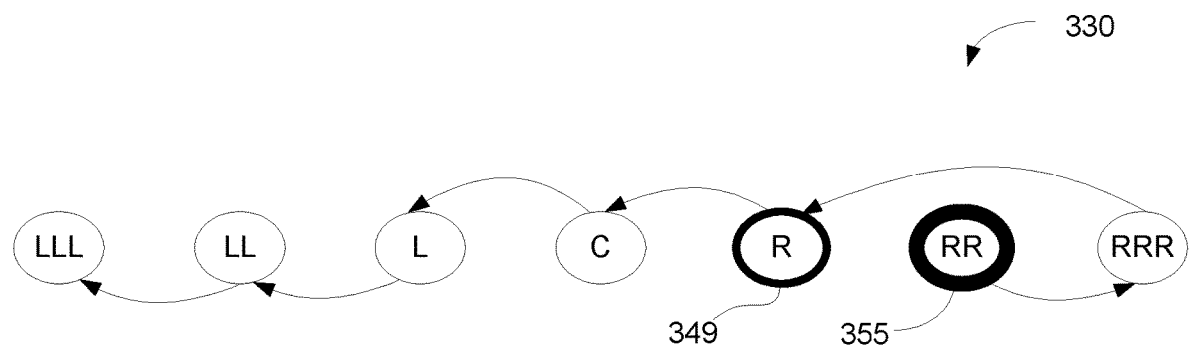

Referring to FIG. 3D, as shown in diagram 330, a preliminary read-level voltage is RR, which is read-level voltage 355. The trend is increasing because read-level voltage 355 is greater than read-level voltage 349. Thus, in this example, based on the increasing trend, a secondary read-level voltage is obtained as read-level voltage RRR because RRR is the next higher read-level voltage compared to RR. As RRR is the highest read-level voltage, there is no read-level voltage that is higher than RRR. Hence, at this point, the direction is reversed (i.e., the direction is decreasing in voltage), and a next read-level voltage is determined as R. Read-level voltage R is lower than any of the read-level voltages that have been selected (i.e., RR and RRR), and R is the highest read-level voltage among the read-level voltages that have not been selected (i.e., LLL, LL, L, C, R). R is next to preliminary read-level voltage RR, and is the next lower read-level voltage compared to RR. Using the same reversed direction, the next read-level voltage is C because C is the next lower read-level voltage. Using the same reversed direction, the next read-level voltage is L because L is the next lower read-level voltage. Using the same reversed direction, the next read-level voltage is LL because LL is the next lower read-level voltage. Using the same reversed direction, the next read-level voltage is LLL because LLL is the next lower read-level voltage. As a result, based on the trend determined by read-level voltages 335 and 349 from the prior successful decoding operations, the sequence of read-level voltages is obtained as RR, RRR, R, C, L, LL, and LLL in that order to be used for a multi-stage decoding operation.

Figure 3E:
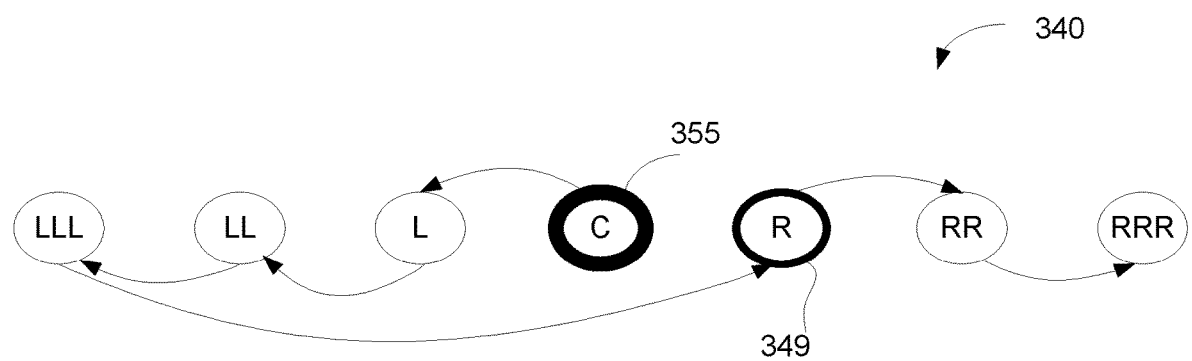

Referring to FIG. 3E, the trend is similar to each of the trends of FIGS. 3B and 3C, except that read-level voltages 355 and 349 are C and R, respectively. Using a similar process as those described with respect to FIGS. 3B and 3C, based on read-level voltage 355 and the trend determined by read-level voltages 335 and 349, the sequence of read-level voltages is obtained as C, L, LL, LLL, R, RR, and RRR in that order to be used for a multi-stage decoding operation.

Figure 3F:
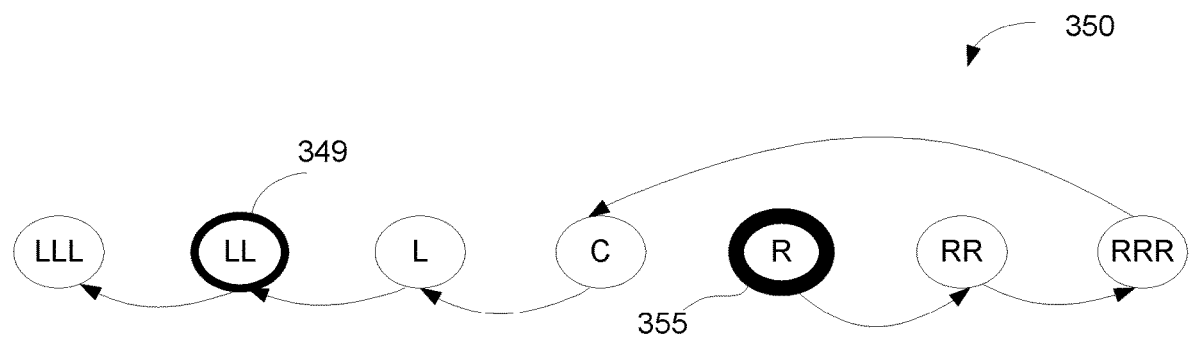

Referring to FIG. 3F, the trend is similar to the trend of FIG. 3D, except that read-level voltages 355 and 349 are R and LL, respectively. Using a similar process as those described with respect to FIG. 3D, based on read-level voltage 355 and the trend determined by read-level voltages 335 and 349, the sequence of read-level voltages is obtained as R, RR, RRR, C, L, LL, and LLL in that order to be used for a multi-stage decoding operation.

In some embodiments, a sequence of read-level voltages are obtained (e.g., determined, selected or set) based on a trend of a set of decoding success indicators. As shown in FIGS. 3B through 3F, a first decoding success indicator may correspond to read-level voltage 355, and a second decoding success indicator may correspond to a read-level voltage 349 that is different from read-level voltage 355. The first and second decoding success indicators may be obtained from at least two recent successful decoding operations. In some examples, the trend is a direction indicated by a change in read-level voltages that were previously used in successful decoding operations (e.g., the change or trend from read-level voltage 349 to read-level voltage 355). In some examples as shown in FIGS. 3B, 3C, and 3E, the trend is decreasing. In some examples as shown in FIGS. 3D and 3F, the trend is increasing. In some examples, the sequence of read-level voltages (or the read-level voltage order) is arranged according to arrows shown in FIGS. 3B through 3F.

In some examples, in determining a sequence (or order) of read-level voltages, when an end of a trend is reached, the direction used to select subsequent read-level voltages for the sequence is reversed, and the process of determining the subsequent read-level voltages continues in a direction reverse of the trend. For example, in FIG. 3B, the trend is decreasing. Hence, the order is L, LL, and then LLL. When LLL is reached (which indicates an end of the trend), the direction used to select subsequent read-level voltages becomes reversed (i.e., the direction becomes reverse of the trend), and the process continues in the reverse direction. Hence, in this example, the order after LLL is C, R, RR and then RRR.

Figure 4:
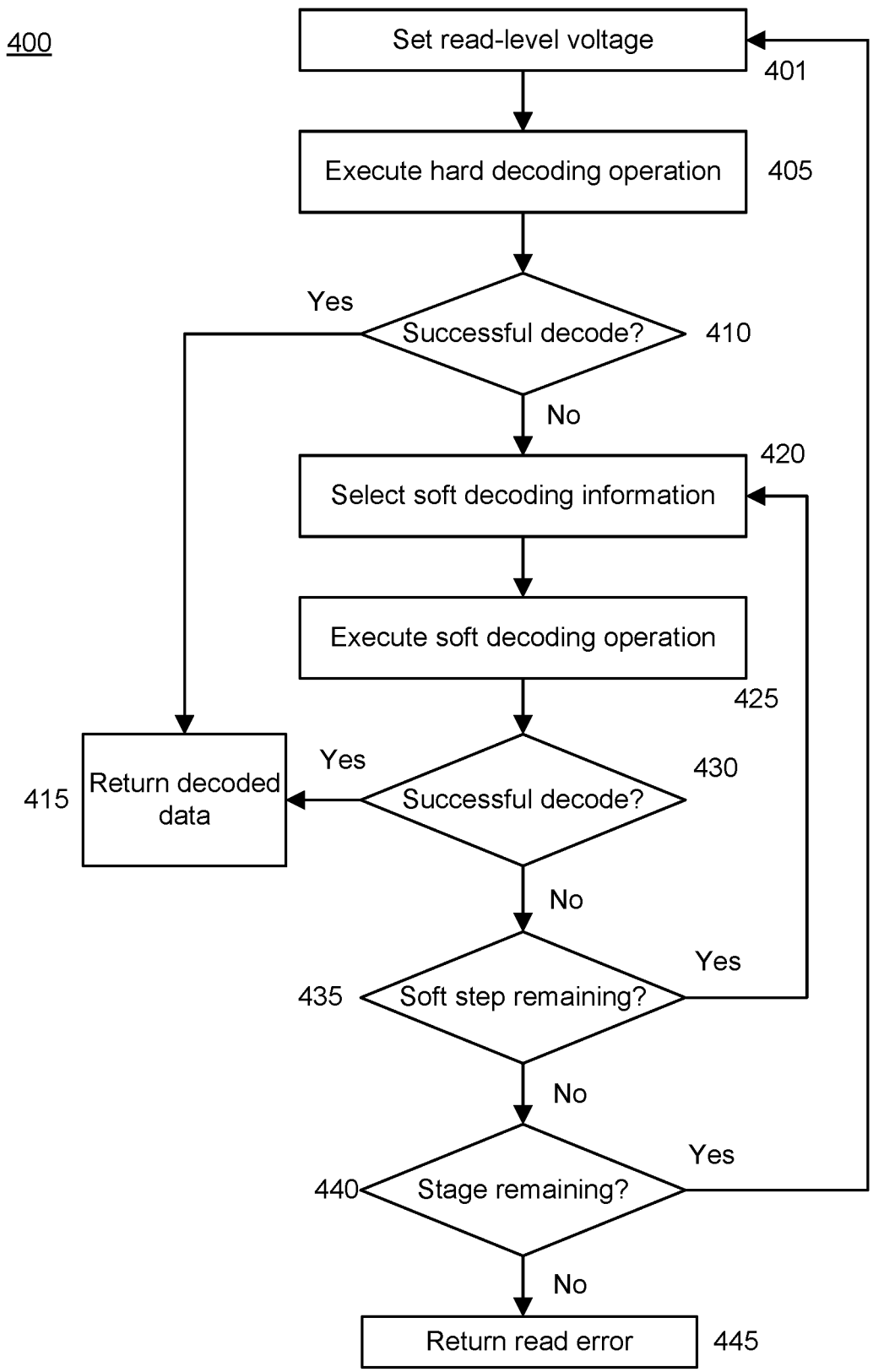
FIGS. 4 through 6 depict flow diagrams of examples of a multi-stage decoding operation according to aspects of the subject technology.

FIG. 4 depicts a flow diagram of an example multi-stage decoding operation 400 according to aspects of the subject technology. In one or more examples, controller 102, encode/decode engine 104, or a combination thereof may perform one or more processes described with respect to FIG. 4. The multi-stage decoding operation may be initiated in response to a read command received from host device 110 or in response to an internal data management operation executed by controller 102. Upon initiating the multi-stage decoding operation, a read-level voltage for the flash memory device 118 from which requested data is to be read is set according to a sequence of read-level voltages (block 401).

A sequence of read-level voltages may be adjusted, determined or set based on a trend of a set of decoding success indicators that includes a first decoding success indicator and a second decoding success indicator obtained from at least two recent successful decoding operations. The first decoding success indicator may correspond to a read-level voltage of the last successful decoding operation, and the second decoding success indicator may correspond to a read-level voltage of the second to the last successful decoding operation. Examples of sequences of read-level voltages determined based on a trend of a set of decoding success indicators may include the sequences described with respect to FIGS. 3B through 3F. Another example of a sequence of read-level voltages may be a default sequence such as the one described with respect to FIG. 3A. In some examples, if the sequence of read-level voltages described with respect to FIG. 3B (e.g., a sequence of read-level voltages L, LL, LLL, C, R, RR, and RRR) is used, then the initial read-level voltage may be set to read-level voltage L. The read-level voltage may be set by programming a register in the flash memory device with a value corresponding to read-level voltage L.

With the read-level voltage set, data is read from a group of memory cells using the set read-level voltage and the data is passed to a hard decoder in encode/decode engine 104 to execute a hard decoding operation on the data (block 405). If the hard decoding operation is successful in decoding the data (block 410), the decoded data is returned to the requesting process (block 415). If the hard decoding operation is unsuccessful, soft decoding information is selected (block 420), and the data together with the soft decoding information is passed to a soft-decision decoder in encode/decode engine 104 to execute a soft decoding operation using the data and the selected soft decoding information (block 425).

If the soft decoding operation is successful in decoding the data (block 430), the decoded data is returned to the requesting process (block 415). If the soft decoding operation is unsuccessful, the process determines whether another soft step or soft decoding operation remains in the current stage of the multi-stage decoding operation (block 435). According to aspects of the subject technology, each stage of the multi-stage decoding operation may include a hard decoding operation and multiple soft decoding operations. Each of the soft decoding operations uses a respective set of soft decoding information corresponding to the current stage. Each set of soft decoding information may be determined or calculated using test or simulation data based on different conditions and assumptions. If the soft decoding operation is unsuccessful using a first set of soft decoding information, the soft decoding operation may be repeated using the same data but with a second selected set of soft decoding information (block 420). This loop of soft decoding operations may be repeated until either the data is successfully decoded or all of the sets of soft decoding information associated with the current stage have been used in soft decoding attempts. According to some examples of the subject technology, each stage may have three sets of soft decoding information with which to attempt soft decoding of data.

If no more soft steps or soft decoding operations remain for the current stage (block 435), the operation determines if another stage remains in the multi-stage decoding operation (block 440). In some examples, the multi-stage decoding operation may include up to seven stages corresponding to, for example, the sequence of seven read-level voltages depicted in FIGS. 2 and 3A through 3F. Having seven stages and seven read-level voltages are examples, and the subject technology is not limited to these numbers. If another stage remains in the operation, the next read-level voltage in the sequence is set (block 401) and the stage operations described above repeat. This loop of hard and soft decoding operations repeats until either the data is successfully decoded and returned to the requesting process (block 415) or all of the hard and soft decoding operations in each of the stages are unsuccessful. If decoding is unsuccessful, a read error is returned to the requesting process (block 445).

Figure 5:
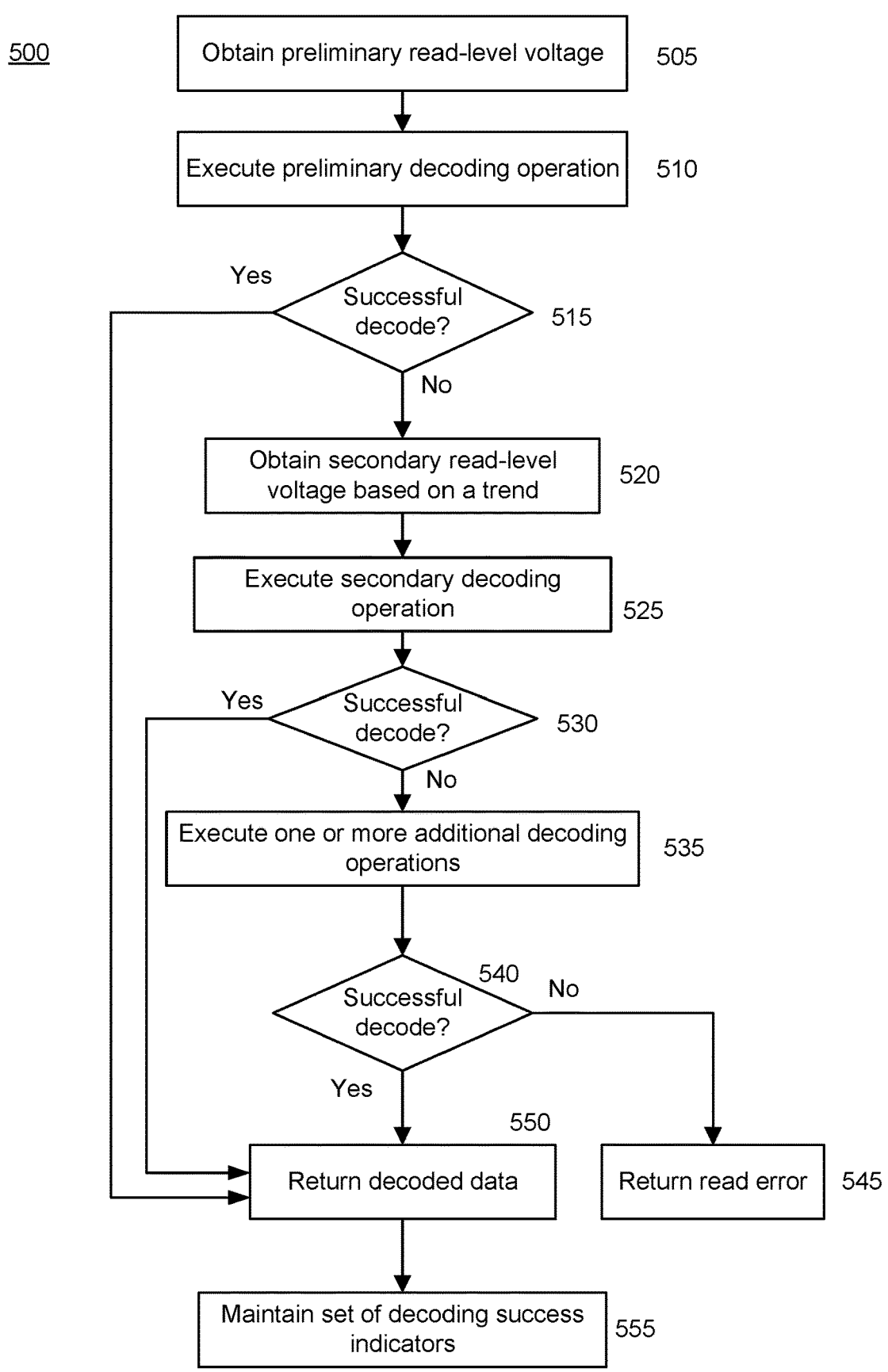

FIG. 5 depicts a flow diagram 500 of an example multi-stage decoding operation according to aspects of the subject technology. In one or more examples, controller 102, encode/decode engine 104, or a combination thereof may perform one or more processes described with respect to FIG. 5. Similar to the process described above with respect to FIG. 4, the multi-stage decoding operation depicted in FIG. 5 may be initiated in response to a read command received from host device 110 or in response to an internal data management operation executed by controller 102.

A sequence of read-level voltages may be adjusted or set as described herein (e.g., the descriptions with respect to FIGS. 3A through 3F and FIG. 4, Initially, a preliminary read-level voltage is obtained, e.g., selected, from the sequence of read-level voltages used in a multi-stage decoding operation (block 505). The preliminary read-level voltage may be obtained from the sequence of read-level voltages based on a decoding success indicator maintained (e.g., by controller 102). According to aspects of the subject technology, the decoding success indicator may be a stored data value indicating the read-level voltage from the sequence of voltages that corresponds to the stage of the multi-stage decoding operation that successfully decoded data in a previous decoding operation. The stored data value (success indicator) may indicate the successful read-level voltage from the last decoding operation on a given block, group of blocks, die, group of die, or flash memory device 118, with respective data values indicating the read-level voltage stored for each block, group of blocks, dies, group of die, or flash memory devices 118 in the data storage system. A single stored data value indicating the read-level voltages last used in a successful decoding operation may be maintained for all flash memory devices 118 in the data storage system in place of individual data values for the different groupings of memory cells listed above in order to minimize memory usage for this data. In some examples, index values indicating the read-level voltages last used in a successful decoding operation may be maintained for all flash memory devices 118 in the data storage system. In some examples as shown in FIGS. 3B through 3F, the decoding success indicator corresponds to a read-level voltage 355 that was last used in a successful decoding operation. Therefore, read-level voltage 355 may be obtained as the preliminary read-level voltage.

In some embodiments, a stack memory may hold data associated with the successful decoding operations. The stack memory data may be updated by the decoding success indicator corresponding to the read-level voltage that was last used in a successful decoding operation. Therefore, the decoding success indicator corresponding to the read-level voltage that was last used in a successful decoding operation may be pushed into the stack memory. The stack memory may be updated each time the decoding success indicator corresponds to a read-level voltage that is different from the read-level voltage of a prior time the stack memory was updated. Therefore, the stack memory includes an ordered decoding success indicators such that the decoding success indicators are arranged according to the time of their respective successful decoding operations. In some examples, the stack memory includes two or more memory locations, e.g., two memory locations, and thus holds the decoding success indicators correspond to the last two successful decoding operations. In some examples, the stack memory includes two or more memory locations, e.g., four memory locations, and thus holds the decoding success indicators correspond to the last four successful decoding operations. In some examples, the most recent decoding success indicator is on top of the stack memory. The read-level voltage corresponding to the most recent decoding success indicator may be selected as the preliminary read-level voltage.

In one or more examples, a trend of the decoding success indicators is determined based at least on the data in the stack memory. The trend may be determined based on the read-level voltages corresponding to the decoding success indicators of the stack memory. In some examples, the trend indicates whether the read-level voltages corresponding to the decoding success indicators of the stack memory are increasing or decreasing. In some examples, the stack memory includes two memory locations, and thus holds the decoding success indicators that correspond to the last two successful decoding operations. Thus, the trend may indicate whether a change in the read-level voltages corresponding to the last two successful decoding operations is increasing or decreasing (e.g., an increase or decrease in read-level voltages). Thus, a trend may be indicated as either increasing or decreasing (e.g., increasing or decreasing in read-level voltages).

In one or more aspects, a read-level voltage corresponding to the last successful decoding operation (i.e., the last successful read-level voltage) is compared to a read-level voltage corresponding to the second to the last successful decoding operation (i.e., the second to the last successful read-level voltage). When the last successful read-level voltage is less than the second to the last successful read-level voltage, the trend is determined to be decreasing (or decreasing in read-level voltages). When the last successful read-level voltage is greater than the second to the last successful read-level voltage, the trend is determined to be increasing (or increasing in read-level voltages). For example, each of the trends for FIGS. 3B, 3C and 3E is decreasing because the read-level voltage 355 is less than the read-level voltage 349. Each of the trends for FIGS. 3D and 3F is increasing because the read-level voltage 355 is greater than the read-level voltage 349.

In one or more examples, the stack memory or the respective memory location described above includes a set of decoding success indicators corresponding to a history of successful decoding operations. In some examples, the set of decoding success indicators includes at least two decoding success indicators. In some examples, the set of decoding success indicators comprises two or more successive decoding success indicators that include a most recent decoding success indicator and a second to the most recent decoding success indicator.

In one or more examples, the set of decoding success indicators includes a first decoding success indicator and a second decoding success indicator. The trend of the set of decoding success indicators may be determined based on a trend between a read-level voltage corresponding to the first decoding success indicator and a read-level voltage corresponding to the second decoding success indicator. The first decoding success indicator may be more recent than the second decoding success indicator. In some examples, the first and second decoding success indicators are successive decoding success indicators that correspond to two different read-level voltages. In some examples, the first decoding success indicator is the most recent decoding success indicator. In some examples, a secondary read-level voltage may be obtained from a sequence of read-level voltages based on the trend between the second to the last successful read-level voltage and the last successful read-level voltage.

Using the preliminary read-level voltage, a preliminary decoding operation is executed (block 510). In particular, data is read from a group of memory cells using the preliminary read-level voltage and the data is passed to a decoder in encode/decode engine 104 for decoding. If the preliminary decoding operation is successful, the decoded data is returned to the requesting process (block 550). In some examples, data is read from the group of memory cells using the preliminary read-level voltage and the data is passed to a hard decoder in encode/decode engine 104 for decoding (block 405) and then blocks 410-430, including soft decoding, may be executed.

If the preliminary decoding operation is unsuccessful, a secondary read-level voltage is obtained, e.g., determined, from the sequence of read-level voltages used in the multi-stage decoding operation (block 520). The secondary read-level voltage may be obtained (e.g., selected) based on the trend of the read-level voltages corresponding to the successful decoding operations. When the trend of the read-level voltages is increasing, the secondary read-level voltage may be obtained from the read-level voltages such that the secondary read-level voltage is greater than the preliminary read-level voltage. For example, a secondary read-level voltage is a next higher read-level voltage above the preliminary read-level voltage. Stated in another way, a secondary read-level voltage is a next read-level voltage that is greater than the preliminary read-level voltage.

When the trend of the read-level voltages is decreasing, the secondary read-level voltage may be obtained from the sequence of read-level voltages such that the secondary read-level voltage is less than the preliminary read-level voltage. For example, a secondary read-level voltage is a next lower read-level voltage below the preliminary read-level voltage. Stated in another way, a secondary read-level voltage is a next read-level voltage that is less than the preliminary read-level voltage.

The process of obtaining a preliminary read-level voltage and a secondary read-level voltage is described in more detail with respect to FIGS. 3B through 3F. In one or more examples, a preliminary read-level voltage is the last successful read-level voltage (e.g., the read-level voltage 335 in FIGS. 3B through 3F). In one or more examples, a secondary read-level voltage is the read-level voltage that is adjacent to the preliminary read-level voltage and that is either greater or less than the preliminary read-level voltage depending on the trend, but a secondary read-level voltage is not the second to the last successful read-level voltage (e.g., not the read-level voltage 349 in FIGS. 3B through 3F). In FIG. 3B, the secondary read-level voltage is the read-level voltage LL. In FIG. 3C, the secondary read-level voltage is the read-level voltage LLL. In FIG. 3D, the secondary read-level voltage is the read-level voltage RRR. In FIG. 3E, the secondary read-level voltage is the read-level voltage L. In FIG. 3F, the secondary read-level voltage is the read-level voltage RR.

With the secondary read-level voltage, a secondary decoding operation is executed (block 525). In particular, data is read from a group of memory cells using the selected secondary read-level voltage and the data is passed to a decoder in encode/decode engine 104 for decoding. If the secondary decoding operation is successful, the decoded data is returned to the requesting process (block 550). In some examples, data is read from the group of memory cells using the selected secondary read-level voltage and the data is passed to a hard decoder in encode/decode engine 104 for decoding (block 405) and then blocks 410-430, including soft decoding, may be executed.

If the secondary decoding operation is unsuccessful, one or more additional decoding operations represented in FIG. 4 may be used to decode the data stored in the memory cells (block 535). In some examples, the one or more decoding operations may be executed based on the trend of the read-level voltages corresponding to the previously successful decoding operations. In some examples, the one or more decoding operations may be executed according to the ordered read-level voltages described with regards to FIGS. 3B through 3F (excluding the preliminary and secondary read-level voltages as these have been used in blocks 505-525). In some examples, the ordered read-level voltages described with regards to FIGS. 3B through 3F may be based on the trend of the read-level voltages corresponding to the previously successful decoding operations. One or more aspects of the subject technology allows adjusting the sequence (or order) of read-level voltages based on the trend of the read-level voltages corresponding to previously successful decoding operations. When a decoding operation is unsuccessful (e.g., a decoding operation using the preliminary read-level voltage of the sequence of read-level voltages), a secondary read-level voltage and/or other subsequent read-level voltages of the sequence of read-level voltages can be used to retry the decoding operation.

If one of the one or more additional decoding operations is successful (block 540), the decoded data may be returned to the requesting process (block 550). If the one or more additional decoding process is unsuccessful (block 540), a read error may be returned to the requesting process (block 545).

Following a successful decoding operation of the data, a set of decoding success indicators may be maintained (block 555). For example, the corresponding data value may be updated based on the success of the preliminary or secondary decoding operation using the preliminary or secondary read-level voltage or the one or more additional decoding operations during which the data was successfully decoded. In the example using the stack memory described above, the decoding success indicator of the preliminary or secondary decoding operation or the one or more additional decoding operations during which the data was successfully decoded—may be pushed into the stack memory.

The plurality of memory cells may be part of a block of a plurality of blocks on the non-volatile memory device, and the controller or another component (e.g., another component in data storage system 100 or flash memory device 118) may maintain a respective decoding success indicator for the block, a group of blocks comprising the block, or the non-volatile memory device.

Each stage of a multi-stage decoding operation may include executing one or more decoding operations to decode data read from the plurality of memory cells using a respective read-level voltage from the sequence of read-level voltages corresponding to the stage. The stages of the multi-stage decoding operation may be executed sequentially until one of the one or more decoding operations in one of the stages successfully decodes the data read from the plurality of memory cells. The one or more decoding operations of each stage of the multi-stage decoding operation may include a hard decoding operation and up to a plurality of soft decoding operations. In some examples, the stages of the multi-stage decoding operation may be executed based on a sequence of read-level voltages such as the sequences described with respect to FIGS. 3B through 3F.

Each decoding success indicator may correspond to one read-level voltage of the sequence of read-level voltages. Maintaining the decoding success indicators includes setting the decoding success indicators to indicate the read-level voltages from the sequence of read-level voltages used to decode data successfully. The decoding success indicator may be maintained by pushing the decoding success indicator of the preliminary or secondary decoding operation or the one or more additional decoding operations during which the data was successfully decoded into the stack memory.

In some embodiments, the set of decoding success indicators is maintained, e.g., updated, when one of the preliminary decoding operation, the secondary decoding operation, or the one or more additional decoding operations is successful.

Figure 6:
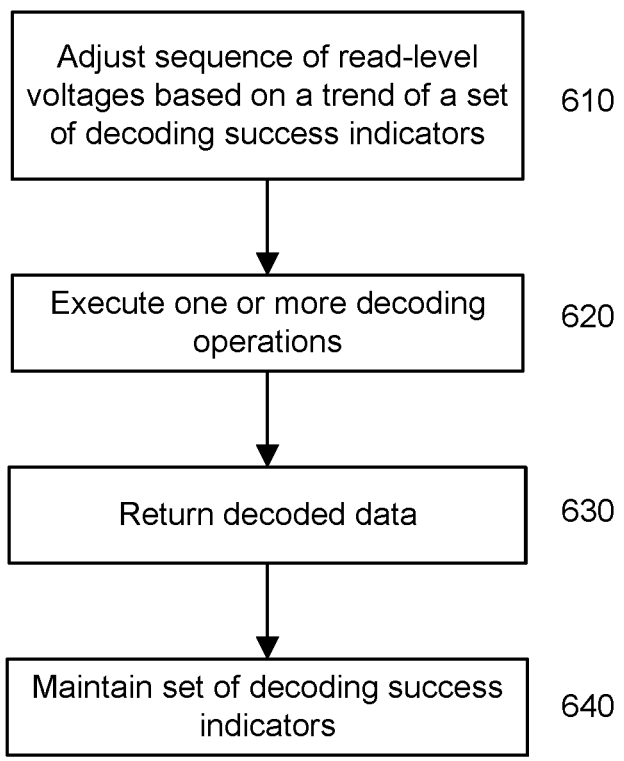

FIG. 6 depicts a flow diagram 600 of an example multi-stage decoding operation according to aspects of the subject technology. In one or more examples, controller 102, encode/decode engine 104, or a combination thereof may perform one or more processes described with respect to FIG. 6. Similar to the process described above with respect to FIG. 4, the multi-stage decoding operation depicted in FIG. 6 may be initiated in response to a read command received from host device 110 or in response to an internal data management operation executed by controller 102.

A sequence of read-level voltages may be adjusted or set based on a trend of a set of decoding success indicators that include at least a first decoding success indicator and a second decoding success indicator obtained from at least two recent (or prior) successful decoding operations (block 610). The first decoding success indicator may correspond to a read-level voltage of the last (or most recent) successful decoding operation. The second decoding success indicator may correspond to a read-level voltage of the second to the last successful decoding operation. Examples of sequences of read-level voltages determined based on a trend of a set of decoding success indicators may include the sequences described with respect to FIGS. 3B through 3F.

A first read-level voltage of the sequence may be set to a read-level voltage corresponding to the first decoding success indicator, when the first decoding success indicator is more recent than the second decoding success indicator. The trend of the set of decoding success indicators is decreasing when the read-level voltage corresponding to the first decoding success indicator is less than the read-level voltage corresponding to the second decoding success indicator. The trend of the set of decoding success indicators is increasing when the read-level voltage corresponding to the first decoding success indicator is greater than the read-level voltage corresponding to the second decoding success indicator. A second read-level voltage of the sequence may be set to a read-level voltage that is less than the first read-level voltage when the trend of the set of decoding success indicators is decreasing. A second read-level voltage of the sequence may be set to a read-level voltage that is higher than the first read-level voltage when the trend of the set of decoding success indicators is increasing.

As shown in FIGS. 3B through 3F, read-level voltages may include the lowest read-level voltage (e.g., LLL) and the highest read-level voltage (RRR). When a read-level voltage in the sequence is the lowest read-level voltage (e.g., LLL), a next read-level voltage in the sequence is a read-level voltage next to and higher than the first read-level voltage (e.g., C in FIG. 3B, L in FIG. 3C, and R in FIG. 3E). When a read-level voltage in the sequence is the highest read-level voltage (e.g., RRR), a next read-level voltage in the sequence is a read-level voltage next to and lower than the first read-level voltage (e.g., R in FIG. 3D and C in FIG. 3F). When a read-level voltage in the sequence is the lowest or the highest read-level voltage (e.g., LLL or RRR), a next read-level voltage in the sequence (e.g., the next read-level voltage after LLL or RRR) is determined based on a direction reverse of the trend.

One or more current decoding operations may be executed to decode data read from a plurality of memory cells based on the sequence of read-level voltages (block 620). A read-level voltage may be used for a decoding operation for a given block, group of blocks, die, group of die, or flash memory device 118. Each of the one or more current decoding operations may be a stage of a multi-stage decoding operations described with respect to FIG. 4, where each stage may include a hard decoding operation (block 405) and one or more software decoding operations (block 425). The plurality of memory cells may be in a flash memory device 118. A first one of the one or more current decoding operations may correspond to a first stage of the multi-stage decoding operations and may use the first read-level voltage of the sequence to decode data. A second one of the one or more current decoding operations, which follows the first one, may correspond to a second stage of the multi-stage decoding operations and may use the second read-level voltage of the sequence to decode data.

The decoded data from one of the one or more current decoding operations may be returned when the one of the one or more current decoding operations is successful (block 630).

The set of decoding success indicators may be maintained based at least on a successful one of the one or more current decoding operations (block 640). Each decoding success indicator may indicate the successful read-level voltage of a prior decoding operation on a given block, group of blocks, die, group of die, or flash memory device 118. The process of maintaining a set of decoding success indicators is described further below.

In one or more examples, when a read-level voltage used for (or associated with) the successful one of the one or more current decoding operations is different from a read-level voltage corresponding to the first decoding success indicator, the following is observed:

a read-level voltage corresponding to the second decoding success indicator is set (or changed) to the read-level voltage corresponding to the first decoding success indicator. For example, the value of the second to the last successful read-level voltage is set to the value of the last successful read-level voltage; and the read-level voltage corresponding to the first decoding success indicator is set (or changed) to the read-level voltage used for the successful one of the one or more current decoding operations. For example, the value of the last successful read-level voltage is set to the value of the current successful read-level voltage.

In one or more examples, when the read-level voltage used for (or associated with) the successful one of the one or more current decoding operations is the same as the read-level voltage corresponding to the first decoding success indicator, the following is observed:

the read-level voltage corresponding to the first decoding success indicator remains at its previous value, is not changed by the successful one of the one or more current decoding operations, and is considered to be the last successful read-level voltage;

the first decoding success indicator remains as the most recent decoding success indicator (or the last decoding success indicator);

the decoding operation associated with the first decoding success indicator remains as the most recent successful decoding operation or (or the last successful decoding operation);

the read-level voltage corresponding to the second decoding success indicator remains at its previous value, is not changed by the successful one of the one or more current decoding operations, and is considered to be the second to the last successful read-level voltage;

the second decoding success indicator remains as the second to the most recent decoding success indicator (or the second to the last decoding success indicator); and the decoding operation associated with the second decoding success indicator remains as the second to the most recent successful decoding operation or (or the second to the last successful decoding operation);

the decoding operations associated with the first and second decoding success indicators may remain as successive recent successful decoding operations; and the decoding operations associated with the first and second decoding success indicators may remain as the two recent successful decoding operations.

In one or more aspects, controller 102 may record the last and the second to the last successful read-level voltages, e.g., per block basis. When controller 102 needs to retry reading and decoding of data, controller 102 may read the two previous read-level voltages for this block, and predict the next read-level voltage. After a successful read retry, controller 102 may compare the current read-level voltage with the last successful read-level voltage. If the two read-level voltages are the same, no update is necessary for the last and the second to the last successful read-voltages. If the two read-level voltages are different, then controller 102 may move the last successful read-level voltage to the second to the last successful read-level voltage, and may move the current read-level voltage to the last successful read-level voltage. In one or more aspects, a pseudo code for maintaining or updating read-level voltages may be represented as follows:

```
int update_read_level_history_per_block(current_read_level, block_id)
{
    if (current_read_level_voltage == last_successful_read_level_voltage[block_id])
    {
        return;
    }
    else
    {
        second_to_last_successful_read_level_voltage[block_id] = last_successful_read_level_voltage[block_id];
        last_successful_read_level_voltage[block_id] = current_read_level_voltage;
    }
}
```

In one or more examples, the word "last" or its variation may sometimes refer to "most recent" or a variation thereof, and vice versa. In one or more examples, the word "previous," "prior" or a variation thereof may sometimes refer to "recent" or a variation thereof, and vice versa.

According to aspects of the subject technology, a machine-implemented method is provided that includes obtaining a preliminary read-level voltage based on a first decoding success indicator, and executing a preliminary decoding operation to decode data read from a plurality of memory cells using the preliminary read-level voltage. When the preliminary decoding operation is unsuccessful, the method includes obtaining a secondary read-level voltage based at least on a trend of a set of decoding success indicators that comprises the first decoding success indicator and a second decoding success indicator, and executing a secondary decoding operation to decode data read from the plurality of memory cells using the secondary read-level voltage. When the secondary decoding operation is unsuccessful, the method includes executing one or more decoding operations to decode data read from the plurality of memory cells based at least on a sequence of read-level voltages. The method further includes maintaining the set of decoding success indicators based at least on a result of the preliminary decoding operation, the secondary decoding operation, or the one or more decoding operations.

According to aspects of the subject technology, a data storage system is provided that includes a non-volatile memory device and a controller. The controller may cause obtaining a preliminary read-level voltage from a sequence of read-level voltages based on a first decoding success indicator, executing a preliminary decoding operation to decode data read from a plurality of memory cells using the preliminary read-level voltage, and returning decoded data from the preliminary decoding operation when the preliminary decoding operation is successful.

When the preliminary decoding operation is unsuccessful, the controller may cause obtaining a secondary read-level voltage from the sequence of read-level voltages based at least on a trend of a set of decoding success indicators that comprises the first decoding success indicator and a second decoding success indicator, executing a secondary decoding operation to decode data read from the plurality of memory cells using the secondary read-level voltage, and returning decoded data from the secondary decoding operation when the secondary decoding operation is successful.

When the secondary decoding operation is unsuccessful, the controller may cause executing one or more decoding operations to decode data read from the plurality of memory cells based at least on the sequence of read-level voltages, and returning decoded data from one of the one or more decoding operations when the one of the one or more decoding operations is successful. The controller may maintain the set of decoding success indicators based at least on a result of the preliminary decoding operation, the secondary decoding operation, or the one or more decoding operations.

According to aspects of the subject technology, a data storage system is provided that includes a non-volatile memory device and a controller. The controller may adjust a sequence of read-level voltages based on a trend of a set of decoding success indicators that comprise at least a first decoding success indicator and a second decoding success indicator obtained from at least two recent successful decoding operations. The controller may further execute one or more decoding operations to decode data read from a plurality of memory cells based on the sequence of read-level voltages, and return decoded data from one of the one or more decoding operations when the one of the one or more decoding operations is successful. The controller may further maintain the set of decoding success indicators based at least on a successful one of the one or more decoding operations.

According to aspects of the subject technology, a non-transitory machine-readable medium including machine-executable instructions thereon that, when executed by a processor, perform a method that includes setting a sequence of read-level voltages based on a trend of a set of decoding success indicators that comprise at least a first decoding success indicator and a second decoding success indicator. The method also includes performing one or more decoding operations to decode data read from a plurality of memory cells based on the sequence of read-level voltages, returning decoded data from one of the one or more decoding operations when the one of the one or more decoding operations is successful, and maintaining the set of decoding success indicators based at least on a successful one of the one or more decoding operations.

According to aspects of the subject technology, a data storage system is provided that includes means for setting a sequence of read-level voltages using a trend of a set of decoding success indicators that comprise at least a first decoding success indicator and a second decoding success indicator obtained from at least two recent successful decoding operations. The data storage system further includes means for executing one or more decoding operations to decode data read from a plurality of memory cells based on the sequence of read-level voltages, means for providing decoded data from one of the one or more decoding operations when the one of the one or more decoding operations is successful, and means for maintaining the set of decoding success indicators based at least on a successful one of the one or more decoding operations.

Many of the above-described features and applications may be implemented as software or firmware processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

The term "software" is meant to include, where appropriate, firmware residing in read-only memory or other forms of memory, which may be read into memory for processing by a processor. In addition, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a standalone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus, the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the present disclosure or that such implementation applies to all configurations of the present disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A data storage system, comprising:
   storage memory; and
   one or more controllers configured to cause:
     determining a trend of a group of successful decoding indicators,
       the group comprising first and second successful decoding indicators, the first successful decoding indicator obtained more recently than the second successful decoding indicator, a read voltage corresponding to the first successful decoding indicator being greater than a read voltage corresponding to the second successful decoding indicator when the trend is increasing;
     determining a progression of decoding read voltages, to be used for one or more decoding operations, based on the trend,
       the decoding read voltages comprising first and second decoding read voltages in sequence, the first decoding read voltage being less than the second decoding read voltage when the trend is increasing; and
     executing the one or more decoding operations on data obtained from the storage memory,
     wherein the trend indicates whether read voltages are increasing or decreasing for successful decoding.

2. The data storage system of claim 1, wherein:
   the one or more controllers are configured to cause:
   applying the first decoding read voltage prior to the second decoding read voltage in the one or more decoding operations;
   the first decoding read voltage is the same as the read voltage corresponding to the first successful decoding indicator; and
   the second decoding read voltage is different from the read voltage corresponding to the second successful decoding indicator.

3. The data storage system of claim 1, wherein:
   the one or more controllers are configured to cause maintaining the group of successful decoding indicators, based at least on a successful one of the one or more decoding operations; and
   maintaining the group of successful decoding indicators comprises:
     when a decoding read voltage used for the successful one of the one or more decoding operations is different from the read voltage corresponding to the first successful decoding indicator:
       setting the read voltage corresponding to the second successful decoding indicator to the read voltage corresponding to the first successful decoding indicator; and
       setting the read voltage corresponding to the first successful decoding indicator to the decoding read voltage used for the successful one of the one or more decoding operations.

4. The data storage system of claim 1, wherein:
   the decoding read voltages in the progression comprise lowest and highest decoding read voltages among the decoding read voltages; and
   when one decoding read voltage in the progression is the lowest or the highest decoding read voltage, and when the one decoding read voltage is not the last decoding read voltage for the one or more decoding operations,
     a next decoding read voltage in the progression is a decoding read voltage next to the read voltage corresponding to the first successful decoding indicator.

5. The data storage system of claim 1, wherein:
   the decoding read voltages in the progression comprise a lowest decoding read voltage among the decoding read voltages; and
   when one decoding read voltage in the progression is the lowest decoding read voltage, and when the one decoding read voltage is not the last decoding read voltage for the one or more decoding operations,
     a next decoding read voltage in the progression is a decoding read voltage next to and higher than the read voltage corresponding to the first successful decoding indicator.

6. The data storage system of claim 1, wherein:
   the decoding read voltages in the progression comprise a lowest decoding read voltage and a highest decoding read voltage among the decoding read voltages in the progression; and
   when one decoding read voltage in the progression is the lowest or the highest decoding read voltage, the one or more controllers are configured to cause determining a next decoding read voltage in the progression based on a direction reverse of the trend.

7. The data storage system of claim 1, wherein determining the progression of decoding read voltages comprises setting the first decoding read voltage, which is a first one in the progression, to the read voltage corresponding to the first successful decoding indicator.

8. The data storage system of claim 7, wherein:
   determining the progression of decoding read voltages comprises setting the second decoding read voltage, which is a second one in the progression to be used for the one or more decoding operations, to a decoding read voltage that is greater than the first decoding read voltage when the trend is increasing; and
   the second decoding read voltage is different from the read voltage corresponding to the second successful decoding indicator.

9. The data storage system of claim 8, wherein a first one of the one or more decoding operations is based on the first decoding read voltage, and a subsequent one of the one or more decoding operations is based on the second decoding read voltage.

10. A method, comprising:
    determining a trend of a group of successful decoding indicators,
      the group comprising first and second successful decoding indicators, the first successful decoding indicator obtained more recently than the second successful decoding indicator, a read voltage corresponding to the first successful decoding indicator being greater than a read voltage corresponding to the second successful decoding indicator when the trend is increasing;
    determining a progression of decoding read voltages, to be used for one or more decoding operations, based on the trend,
      the decoding read voltages comprising first and second decoding read voltages in sequence, the first decoding read voltage being less than the second decoding read voltage when the trend is increasing; and
    executing the one or more decoding operations on data obtained from storage memory,
    wherein the trend indicates whether read voltages are increasing or decreasing for successful decoding.

11. The method of claim 10, wherein:
the first decoding read voltage is the same as the read voltage corresponding to the first successful decoding indicator;
the second decoding read voltage is different from the read voltage corresponding to the second successful decoding indicator; and
executing the one or more decoding operations comprises executing the one or more decoding operations using the first decoding read voltage prior to using the second decoding read voltage.

12. The method of claim 10, wherein:
the method comprises maintaining the group of successful decoding indicators, based at least on a successful one of the one or more decoding operations; and
maintaining the group of successful decoding indicators comprises:
when a decoding read voltage used for the successful one of the one or more decoding operations is different from the read voltage corresponding to the first successful decoding indicator:
setting the read voltage corresponding to the second successful decoding indicator to the read voltage corresponding to the first successful decoding indicator; and
setting the read voltage corresponding to the first successful decoding indicator to the decoding read voltage used for the successful one of the one or more decoding operations.

13. The method of claim 10, wherein:
the decoding read voltages in the progression comprise lowest and highest decoding read voltages among the decoding read voltages; and
when one decoding read voltage in the progression is the lowest or the highest decoding read voltage, and when the one decoding read voltage is not the last decoding read voltage for the one or more decoding operations, a next decoding read voltage in the progression is a decoding read voltage next to the read voltage corresponding to the first successful decoding indicator.

14. The method of claim 10, wherein determining the progression of decoding read voltages comprises setting the first decoding read voltage, which is a first one in the progression, to the read voltage corresponding to the first successful decoding indicator.

15. The method of claim 14, wherein:
determining the progression of decoding read voltages comprises setting the second decoding read voltage, which is a second one in the progression to be used for the one or more decoding operations, to a decoding read voltage that is greater than the first decoding read voltage when the trend is increasing; and
the second decoding read voltage is different from the read voltage corresponding to the second successful decoding indicator.

16. The method of claim 15, wherein a first one of the one or more decoding operations is based on the first decoding read voltage, and a subsequent one of the one or more decoding operations is based on the second decoding read voltage.

17. An apparatus, comprising:
means for determining a trend of a group of successful decoding indicators, the group comprising first and second successful decoding indicators, the first successful decoding indicator obtained more recently than the second successful decoding indicator, a read voltage corresponding to the first successful decoding indicator being greater than a read voltage corresponding to the second successful decoding indicator when the trend is increasing;
means for determining a progression of decoding read voltages, to be used for one or more decoding operations, based on the trend,
the decoding read voltages comprising first and second decoding read voltages in sequence, the first decoding read voltage being less than the second decoding read voltage when the trend is increasing; and
means for executing the one or more decoding operations on data read from storage memory,
wherein the trend indicates whether read voltages are increasing or decreasing for successful decoding.

18. The apparatus of claim 17, wherein:
the first decoding read voltage is the same as the read voltage corresponding to the first successful decoding indicator;
the second decoding read voltage is different from the read voltage corresponding to the second successful decoding indicator; and
the means for executing the one or more decoding operations comprises means for executing the one or more decoding operations using the first decoding read voltage prior to using the second decoding read voltage.

19. The apparatus of claim 17, wherein:
the apparatus comprises means for maintaining the group of successful decoding indicators, based at least on a successful one of the one or more decoding operations; and
the means for maintaining the group of successful decoding indicators comprises:
when a decoding read voltage used for the successful one of the one or more decoding operations is different from the read voltage corresponding to the first successful decoding indicator:
means for setting the read voltage corresponding to the second successful decoding indicator to the read voltage corresponding to the first successful decoding indicator; and
means for setting the read voltage corresponding to the first successful decoding indicator to the decoding read voltage used for the successful one of the one or more decoding operations.

20. The apparatus of claim 17, wherein:
the decoding read voltages in the progression comprise lowest and highest decoding read voltages among the decoding read voltages; and
when one decoding read voltage in the progression is the lowest or the highest decoding read voltage, and when the one decoding read voltage is not the last decoding read voltage for the one or more decoding operations, a next decoding read voltage in the progression is a decoding read voltage next to the read voltage corresponding to the first successful decoding indicator.

\* \* \* \* \*